United States Patent [19]
Vasudev

[11] Patent Number: 5,480,747
[45] Date of Patent: Jan. 2, 1996

[54] ATTENUATED PHASE SHIFTING MASK WITH BURIED ABSORBERS

[75] Inventor: Prahalad K. Vasudev, Austin, Tex.

[73] Assignee: Sematech, Inc., Austin, Tex.

[21] Appl. No.: 342,939

[22] Filed: Nov. 21, 1994

[51] Int. Cl.$^6$ .................................................. G03F 9/00
[52] U.S. Cl. ............................ 430/5; 430/322; 430/323; 430/224
[58] Field of Search .............................. 430/5, 322, 324, 430/323; 378/34, 35

[56] References Cited

U.S. PATENT DOCUMENTS

| | | |
|---|---|---|
| 4,414,317 | 11/1983 | Culp et al. . |
| 4,434,224 | 2/1984 | Yoshikawa et al. . |
| 4,890,309 | 12/1989 | Smith et al. . |
| 5,208,125 | 5/1993 | Lowrey et al. . |
| 5,217,830 | 6/1993 | Lowrey . |
| 5,225,035 | 7/1993 | Rolfson . |
| 5,288,569 | 2/1994 | Lin ............................................. 430/5 |

OTHER PUBLICATIONS

"Chrome dry etching for photomask fabrication"; W. W. Flack et al.; SPIE vol. 1809, 12th Annual BACUS Symposium (1992); pp. 85–96.

Primary Examiner—S. Rosasco
Attorney, Agent, or Firm—William W. Kidd

[57] ABSTRACT

An attenuated phase shifting mask has absorbers embedded (buried) in the mask substrate, instead of on the surface of the substrate. The buried absorbers allow for controlling attenuation and phase shifting parameters. The material composition and the thickness of the absorber regions determine the amount of attenuation that is to be achieved, as well as phase shifting in some instances. In other instances, offset distances of the absorbers from the surface of the mask control the phase shift. Light scattering and diffraction is reduced or eliminated by having the absorbers below the surface of the mask. By reducing light scattering and distortion, the mask of the present invention allows for PSM lithography techniques to be extended to ranges of shorter wavelength.

26 Claims, 7 Drawing Sheets

ATTENUATED PHASE SHIFTING MASK WITH BURIED ABSORBERS

BACKGROUND OF THE INVENTION

1. Field of the Invention

The present invention relates to the field of fabricating photomasks for use in the manufacture of semiconductor devices and, more particularly, to the fabrication of phase shifting photomasks for use in submicron lithography techniques.

2. Related Application

This application is related to copending application entitled "Globally Planarized Binary Optical Mask Using Buried Absorbers," Ser. No. 08/342,940, filed Nov. 21, 1994, which is incorporated by reference herein.

3. Prior Art

As semiconductor technology evolves to allow for ever smaller device structures to be fabricated on a wafer, such as a silicon wafer, photomask technology must also improve in order to pattern ever-smaller features on the semiconductor wafer. It is the patterns present on these photomasks that are imaged onto the wafer to define the various features formed on the wafer.

Due to the limitations imposed by the wavelength of light, patterns imaged onto the wafer tend to degrade as feature size shrinks. Various schemes have been devised to extend the lower range limitations imposed by conventional optical lithography. One technique has been the use of ultra-violet light in what is currently known as Deep Ultra-Violet (DUV) to utilize the shorter wavelength in the range of 248 and 193 nanometers. Other more radical techniques suggested are electron-beam (e-beam) and x-ray usage to pattern images at lower submicron ranges. However, recent experimentation in the area of phase shifting masks (PSMs) have shown that PSM technology can be employed to extend the range of optical techniques currently being employed. With phase shifting at DUV wavelengths, optical lithography can be extended to the lower submicron ranges previously considered unattainable by optical lithography.

Phase shifting techniques have been generally known as early as U.S. Pat. No. 4,360,586. One type of PSM that has shown considerable promise is the attenuated phase shifting mask in which an attenuator attenuates the transmitted light passing through it, at the same time shifting the phase of the light (typically, by 180°). One such attenuated PSM is described in U.S. Pat. No. 4,890,309. Attenuated PSMs have emerged as one of the preferred, if not the most preferred, practical approaches to enhancing the lithography "process latitude" or "process window" (depth of focus×exposure latitude) over conventional binary intensity masks.

The attenuator is usually formed from a metallic like light absorbing film, such as chrome or chrome oxide, that has been thinned to allow for about 5%–15% of the incoming light to be transmitted through the material. This partial transmittance of the optical beam through the phase attenuator allows phase shifted light to be produced, which can "interfere" with the non-phase shifted light, thereby improving the edge sharpness and increasing the depth of focus. The thickness of the absorber, as well as the material composition of the absorber, is critical and determines the amount of attenuation and phase shift that occurs. For DUV wavelengths (193–248 nm), the attenuator thickness of Cr films becomes extremely small (<100 Å) and poses a significant practical problem in controlling its uniformity across a mask plate and then etching patterns reliably with control.

The phase shifting that occurs when light passes through the attenuator is dependent on but not necessarily a primary function of the thickness of the attenuator. Therefore, it is difficult to independently control the attenuation and phase shifting that occurs in the absorber material. Adjusting a parameter for one will cause the other to change as well. This type of PSM is called an imbedded PSM.

Another type of PSM uses a transparent dielectric layer of known thickness that is generally deposited above or below the absorber to provide for an additional phase shift to that of the absorber. This structure requires a second aligned lithography step and significantly complicates the overall manufacturing process. The precise alignment of the shifter layer to the absorber layer requires alignment marks and complicates the overall process. The PSMs using a deposited dielectric and absorber come in two varieties called top shifter and bottom shifter configurations.

Thus, there are three types of attenuated PSMs that are generally used in the prior art. The imbedded PSM requires precise control of the thickness for attenuation and phase shift, which can be achieved only over a limited range for materials such as chrome or chrome oxide. Other materials can be employed but the technology to deposit and etch them uniformly across the mask plate is very difficult and must be optimized for each material used. What is needed is a process where the attenuators can be fabricated without requiring an etch of the material. Also, one must be able to deposit the material to have a very smooth surface and have precise thicknesses.

Because of these limitations, prior art phase shifting masks that have provided adequate performance till now will have severe shortcomings as shorter wavelengths (for example, 193 nm) are exploited for conventional optical lithography. The present invention describes a phase shifting photomask having improved performance that is easily extendible to shorter wavelengths without adding additional complexity in manufacturing.

SUMMARY OF THE INVENTION

An attenuated phase shifting mask (PSM) using buried absorbers and methods for manufacturing such masks are described. The mask of the present invention utilizes buried absorber regions, wherein absorbers for the mask are embedded in the mask substrate and are not formed on the surface of the mask. Light scattering at rough vertical edges of absorbers of prior art masks are reduced or eliminated with the mask of the present invention, since much of the scattering is reflected back in to the substrate to improve the projected image.

Unlike the prior art masks, the properties (material composition and thickness) of the buried absorber are utilized to control the phase and attenuation parameter. The depth of the absorber regions from the surface of the mask surface establishes an offset distance which can be used to adjust the phase shifting parameter. Thus, the amount of attenuation and the amount of phase shifting to be achieved (usually 180°) can be controlled independently of each other.

Furthermore, since the buried absorbers have an offset distance from the surface of the substrate, defects and contaminants at the surface of the mask are no longer in the image plane, wherein alleviating a need for a pellicle to protect the mask surface. Edge scattering is also reduced due to the buried nature of the absorbers. By reducing light scattering and distortion, the mask of the present invention allows for conventional optical PSM lithography to be extended to ranges of shorter wavelength.

Methods are described for fabricating masks of the present invention. In one method, trenches are formed in a quartz substrate and filled with an absorber material. After planarization, a dielectric layer is formed over the surface of the mask and the filled trenches or another quartz layer is bonded over it and then etched back. The thickness of the trench determines the thickness of the absorber region and the thickness of the overlying layer determines the offset distance of the absorber region from the surface of the mask. If the absorber induced phase shift is insufficient to provide the required 180°, then a simple self-aligned blanket flood exposure is performed from the backside to selectively expose the quartz regions where no absorbers are present. The quartz is then etched in the nonphase shift regions to a depth d equal to the offset parameter.

In an alternative method, a portion of a substrate surface is exposed by an overlying patterned oxide layer. Subsequently, ions are implanted into the exposed regions to form absorber regions within the substrate at a specified depth. The dosage of the ions determines the thickness of the absorber regions and the implantation energy determines the depth, which corresponds to the offset distance of the absorber region from the surface. If required, a selective quartz etch can be used to further adjust the phase shift to provide the required 180° value.

Economic Advantage:

By enhancing photomasks to permit the use of optical lithography at shorter wavelengths, new lithography techniques and tools need not be utilized for producing semiconductor devices having smaller-dimensioned features.

DETAILED DESCRIPTION OF THE PREFERRED EMBODIMENTS

An attenuated phase shifting mask, having buried absorbers, for use in submicron optical lithography to fabricate semiconductor devices is described. In the following description, numerous specific details are set forth, such as specific structures, processes, chemical compositions, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

PRIOR ART

Figure 1:
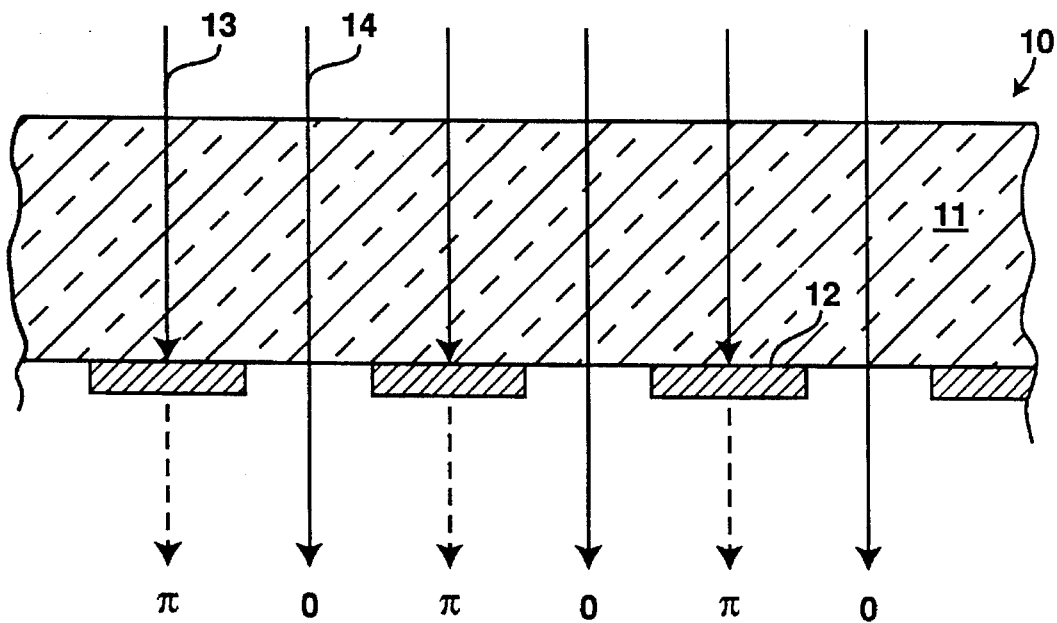
FIG. 1 is a cross-sectional diagram showing a prior art imbedded, attenuated PSM, having light absorbers on its surface.

Referring to FIG. 1, a typical imbedded, attenuated phase shifting mask (PSM) 10 well-known in the prior art is shown. Mask 10 is comprised of a quartz substrate 11 containing a patterned feature of metallic absorber film 12 formed on its surface. The PSM 10 is designed such that transmitted light rays 13 traversing through the absorber film 12 are shifted 180 degrees in phase as compared to light rays 14 traversing only through the quartz. The absorber material is specifically selected so that it provides both the required 180 degree phase shift and the required 80%–90% attenuation of transmitted light. While this approach appears simple, in most practical applications, it is difficult to make the absorber material flexible for operating over a wide range of wavelengths (for example, between 193 nm–365 nm). Because the absorber (attenuator) 12 controls the phase and transmission characteristics together, it is difficult to independently adjust either phase or attenuation of light transmitted through the absorber 12 without affecting the other.

With the selection of a certain material for the absorber 12, the only variable for adjustment is the thickness of the absorber layer 12. Unfortunately, the phase shifting value and the light transmission factor are both controlled by the thickness. Thus, it is difficult to fabricate imbedded attenuated PSMs unless the masks are limited to a narrow operating range in terms of wavelength. Even for imbedded PSMs, a pellicle is essential for eliminating surface defects from being imaged.

Figure 2:
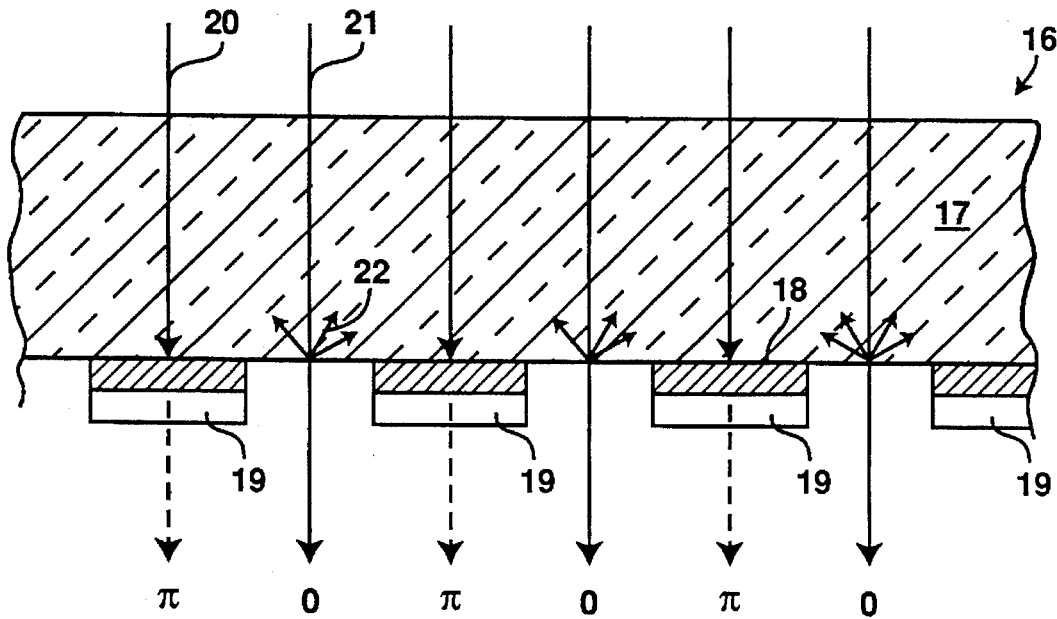
FIG. 2 is a cross-sectional diagram showing another prior art attenuated PSM in which a dielectric layer is formed over the absorbers to form a top shifter PSM.

In FIG. 2, another prior art PSM 16 is illustrated. Similar to mask 10 of FIG. 1, mask 16 also has light absorbers (attenuators) 18 of a given thickness disposed on a quartz substrate 17. A dielectric film layer 19 typically formed from a dielectric material such as $SiO_2$ is blanket deposited (by CVD or other process) over the surface of the absorber 18 and quartz 16. After a second aligned lithography step that selectively protects the deposited $SiO_2$ over the absorber regions, the $SiO_2$ is etched to remove the material from all the non-shifting regions. The dielectric layer 19 functions also to phase shift the light transmission through it so that now total phase shift is determined, not only by the absorber 18, but also by the thickness of the dielectric layer 19. Essentially, light rays 20 traversing though the absorber 18 and dielectric layer 19 should have a phase difference of 180° as compared to light rays 21 traversing through the dielectric layer 19 only.

Figure 3:
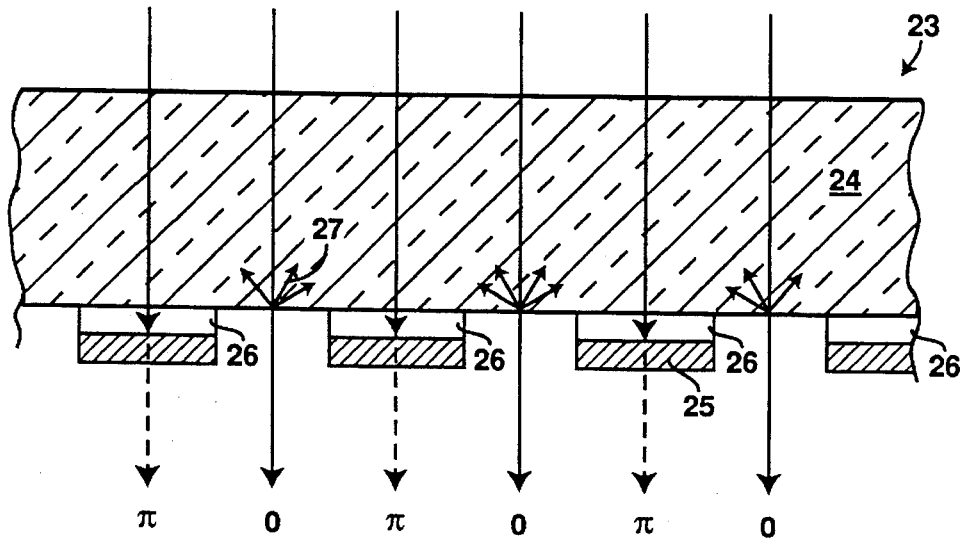
FIG. 3 is a cross-sectional diagram showing another prior art attenuated PSM in which a dielectric layer formed under the absorbers to form a bottom shifter PSM.

A hybrid of the above two prior art approaches is illustrated in FIG. 3. A PSM 23 is comprised of a quartz substrate 24 with absorbers (attenuators) 25 formed thereon. However, in this instance, the dielectric layer 26 is formed on the quartz substrate 24 first and then, the absorbers 25 are formed on the dielectric layer 26. Then, using the absorber as a mask, the $SiO_2$ is etched away over the non-shifting regions, so as to leave the $SiO_2$ only below the absorbers.

In both of the approaches utilizing the dielectric layer, layers 19 and 26 function to independently allow the phase shifting parameter to be adjusted by varying the thickness of the particular dielectric layer 19 or 26 without significantly varying the attenuation parameter.

However, the approaches described in reference to FIGS. 2 and 3 require the formation of a dielectric layer which has an index of refraction different from that of quartz. Because of this quartz-dielectric interface, an index of refraction mismatch occurs, resulting in some amount of scattering of transmitted light, which is illustrated by arrows 22 and 27. Additionally, the formation of such a dielectric layer selectively requires processing steps, such as aligned lithography and etch, which are prone to errors and surface defects that can lead to lower manufacturing yields.

Furthermore, those prior art PSMs which have attenuator regions at or near the surface of the mask substrate can exhibit edge scattering effects that are reflected in the projected image. Such masks also will require a pellicle to cover the mask surface in order to prevent the surface of the mask from being contaminated (which defects lie at or near the image plane of the mask). These limitations are described in more detail in the afore-mentioned related application entitled "Globally Planarized Binary Optical Mask Using Buried Absorbers."

Therefore, it is appreciated that an attenuated phase shifting mask which has capabilities for separate controls for independently controlling the phase shifting and attenuation parameters, while maintaining light scattering to a minimum, would provide significant flexibility for usage at different exposure wavelengths.

PRESENT INVENTION

Figure 4:
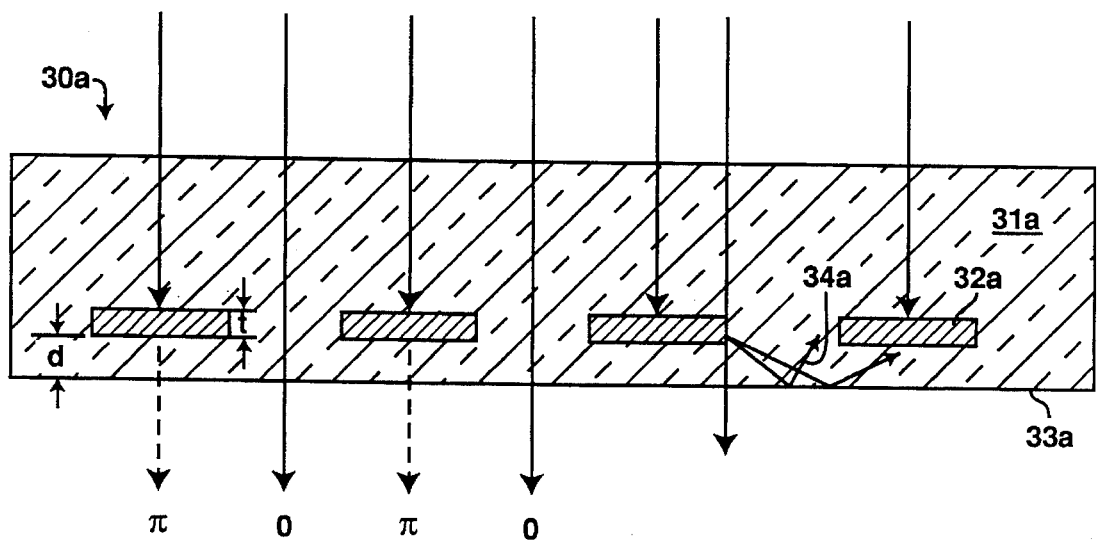
FIG. 4 is a cross-sectional diagram of a buried absorber, attenuated PSM of the present invention in which the surface of the PSM is planar.

Referring to FIG. 4, a mask 30a of the present invention is shown. Mask 30a is an planarized structure having light absorbers 32a fully embedded (burried) within a highly polished quartz substrate 31a. The quartz substrate 31a is equivalent to that of the prior art quartz substrate or mask blank earlier noted, however, now the absorbers 32a are disposed completely within substrate 31a. Therefore, unlike the prior art masks 10, 16 or 23, the absorbers 32a are fully "imbedded" within the quartz 31a. Because the absorbers are no longer on the surface of the quartz, the surface 33a of the substrate 31a is essentially flat, thereby allowing for the mask 30a to have a planarized surface 33a. The image pattern formed by the absorbers 32a is equivalent to that of the prior art PSMs.

As noted in FIG. 4, the optical absorbers 32a are offset by a distance "d" from the surface 33a. Thickness "t" of the absorbers 32a are also denoted in FIG. 4. Thickness t and offset distance d are design parameters that are based on the specific material selected for the absorber 32a and the wavelength used for the exposure. Thus t and d are design parameters and the exact values will depend on the specific application.

The material forming the absorber 32a and its thickness t determine the amount of absorption for light rays transitioning through the absorber 32a. Thus, the attenuation factor is controlled by the material and thickness of absorber 32a. A variety of well-known light absorbing materials can be used for absorber 32a, such selection being dependent on the refractive index desired and the thickness being dependent on the light wavelength being used. The thickness t can be varied to provide the desired attenuation factor. Generally, it is set for 85–95% attenuation, but the actual range is a design choice.

The mask 30a of FIG. 4 is equivalent in operation to the imbedded, attenuated PSM shown in FIG. 1. That is, the absorbers 32a function to provide both the required attenuation and the 180° phase shift. The absorber 32a material is selected so that it provides both the attenuation and the phase shift. This requires the choice of a material in which the phase shift is controlled by the imaginary part of the index and is, thus, not overly sensitive to thickness. That is, the complex index of refraction ($n_{eff}$) of a material is given by the equation $$n_{eff} = n' - ik'$$

where n' is the real part of the index and k' is the imaginary part responsible for the absorption. For quartz, k~0. For most metals, k>>0 and thus the real part of $n_{eff}$ is given by $$Re\ n_{eff} = SQRT((n')^2 + (k')^2)$$

If k>>n, then the index and phase shift are primarily controlled by k. Thus, k essentially controls the phase shift, while the thickness "t" controls the transmission given by the equation $$I = (Io)(e^{-\alpha t})$$

where Io is the incident intensity, I is the transmitted intensity, ∝ is the absorption or extinction coefficient for a given material and t is the thickness. Essentially, the thickness of the absorber material provides the attenuation and the 180° phase shift, similar to the PSM of FIG. 1.

However, in this instance, the absorbers 32a are buried below the surface 33a of the quartz 31a by an offset distance d. The distance d provides a means for reducing scattered or diffracted light (shown by arrows 34a) from the vertical edges of the absorber 32a by internally reflecting them back into the quartz at the quartz-air interface at surface 33a. Since distance d would be selected so that surface 33a is beyond the maximum depth of focus of an exposure system being utilized, any defect at the surface 33a would not be imaged. The determination of the offset distance d, the advantages of internally reflecting scattered and diffracted light 34a and not requiring a pellicle are further described in the aforementioned related application entitled "Globally Planarized Binary Optical mask Using Buried Absorbers," which is incorporated by reference herein.

Figure 5A:
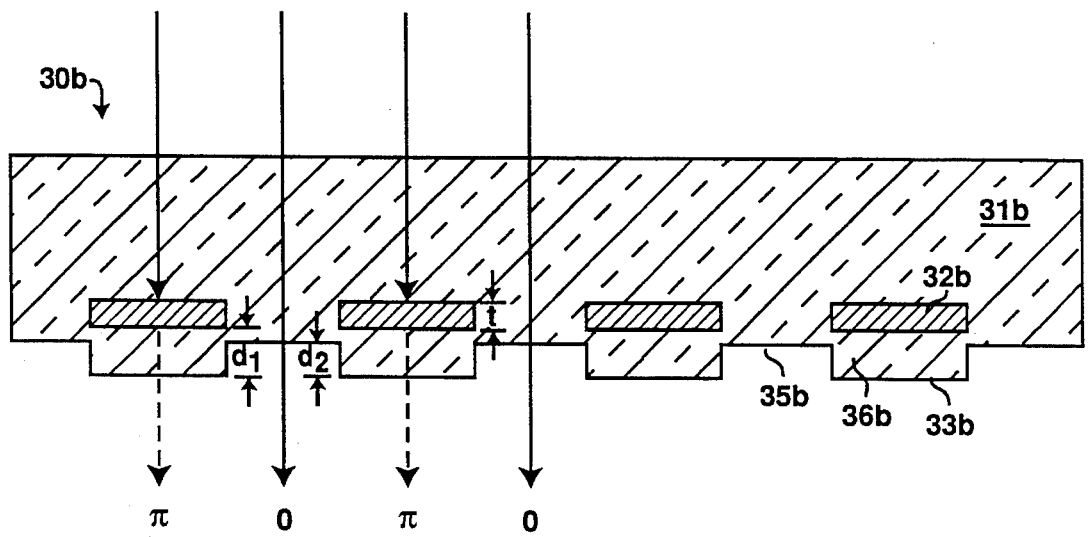
FIG. 5A is a cross-sectional diagram of another embodiment of a buried absorber, attenuated PSM of the present invention in which a phase shifting region resides above the buried absorber.

Referring to FIG. 5A, another embodiment of the present invention is shown. In this embodiment, mask 30b functions equivalent to the attenuated PSMs of FIGS. 2 and 3. In this embodiment, mask 30b is constructed similar to mask 30a, having absorbers 32b formed within mask substrate 31b. However, in this instance, portions of the substrate 31b in the non-shifting regions are etched to form trench regions 35b. The mask 30b is essentially the same mask as mask 30a, except that portions of the quartz in the non-shifting regions are etched to form trenches 35b.

The thickness t still pertains to the thickness of the absorbers 32b, but offset distance $d_1$ now corresponds to the depth of the absorber 32b and offset distance $d_2$ corresponds to the depth of the trench from surface 33b, which is the upper surface of substrate 31b residing in the phase-shifted regions (above absorbers 32b) of mask 30b. The additional thickness of quartz 36b above the absorbers 32b provides additional phase shifting for light transmitting through this phaseshifting region.

Thus, in this instance, the absorbers 32b need not necessarily provide the full 180° phase shifting of transmitted light. The thickness t of the absorber material is selected to provide the 85–95% attenuation and some phase shift. The offset distance $d_2$ provides the rest of the phase shift. The depth of the trench 35b is designed so as to provide the remaining phase shift to bring the total phase shift to 180°. A significant advantage of this type of mask 30b is that less constraints are placed on the absorber 32b, since full 180° need not be provided strictly by the absorber 32b. The remaining phase shift is provided by the overlying quartz region 36b. A suitable selection of the absorber material and quartz can be made over a very wide range using this technique, since the processing is independent of the absorber material.

It is to be appreciated that the offset distance $d_2$ is determined by the depth of the trench 35b relative to the surface 33b. Thus, when an etching step is used to form trenches 35b, the quartz in the non-shifting region is etched to a distance $d_2$. The depth of the trenches 35b can reach the level of the absorbers 32b, but should not exceed the depth where absorbers 32b are located. Thus, when constructing the mask 30b by utilizing the steps described in reference to FIG. 1, absorbers 32b need not lie at a precise distance from the surface of the substrate. However, the absorbers 32b must lie at a distance $d_2$ or greater from the surface of the mask.

Essential, offset distance $d_1$ is selected to be equal to or greater than distance $d_2$. It is desirable to make distance $d_1$ much greater than the depth of focus to eliminate imaging of surface defects. Trench depth $d_2$, in combination with thickness t provide the necessary phase shift. In mathematical terms:

$d_1 \gg$ Depth of Focus (DoF), $d_1 \geq d_2$ and

Total $\phi$ shift = $\phi(t) + \phi(d_2)$

This second type of PSM of the present invention also has the added advantage of reducing scattered and diffracted light from transitioning to the target. With proper placement of the absorber 32b below the surface of the substrate 31b, scattered and diffracted light 34b are reflected back into the substrate 31b, thereby reducing edge distortion. The offset can be of sufficient depth to ensure reduction of surface scattering. As noted earlier, a pellicle is not needed.

For both types of masks 30a and 30b, the offset distance (d or $d_2$) is calculated based on the equation $(i\lambda)/2(n-1)$, where $\lambda$ is the wavelength, n is the refractive index of the shifter material and i is a multiple factor (i=1 for a 180° phase shift). The offset distance will become smaller as the exposure wavelength shortens. For an exposure wavelength of 365 nm (nanometers), the offset distance is approximately 4000 Å for a 180° phase shift.

Figure 5B:
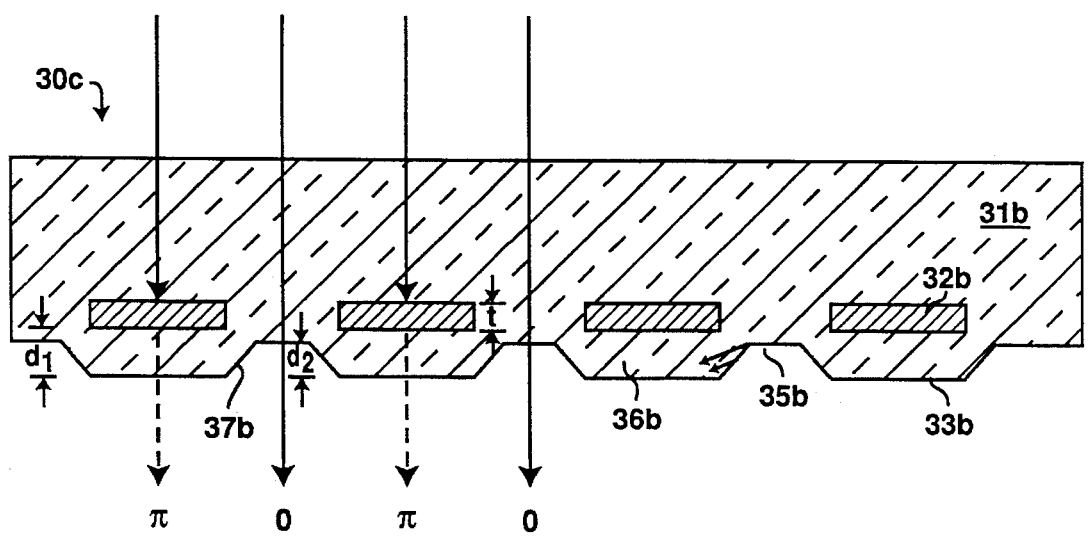
FIG. 5B is a cross-sectional diagram of the embodiment of FIG. 5A, but wherein sidewalls of the phase shifting regions are tapered to provide for reduction in scattering.

Referring to FIG. 5B, an alternative embodiment to the mask of FIG. 5A is shown. Mask 30c in this instance is equivalent to mask 30b, except that the sidewalls 37b of the trench are now slightly tapered. As is shown in the diagram, slight tapering tends to reduce further scattering due to the non-vertical topography. This embodiment can be used if light scattering is severe, as when waveguiding effects occur within the trench region. However, if scattering is not severe, it is preferable to maintain vertical sidewalls, since tapering the sidewalls will more than likely result in deteriorated performance by the mask.

Thus, by using the buried absorber, attenuated PSMs of the present invention, a number of advantages are derived over the prior art attenuated PSM technology. Most notable is the ability to reduce edge distortion so as to permit masks for use at shorter wavelengths. The material and thickness of the absorber basically will control the amount of attenuation and perhaps the phase shift. Where the absorber material does not provide the required phase shift, the offset distance $d_2$ is used to provide the flexibility of adjusting the amount of phase shift. Because these parameters can be adjusted, design latitudes allow for mask design over a wide range of wavelength. This also permits the use of a variety of materials for the absorber, since phase shifting parameters need not necessarily be built into the constraints imposed on the absorber with the second type of mask 30b. Also, pellicles are not necessarily needed if the absorbers are at a depth greater than the DoF.

Metallic materials, such as chromium, molybdenum and tantalum, are preferred for the absorber. Other metallic materials are Au, Ti, Mo, W, Ni, Sn, $SnO_2$ and Ga. However, semiconductor, such as silicon and germanium can be used as well, if desired. In some instances, insulators, such as C, SiC and $Si_3N_4$, can be used as well. It is to be appreciated that the invention is not limited to these elements or compounds and that other materials can be readily utilized as well. Finally, where the present invention utilizes a mask substrate of one material, typically quartz, and an absorber formed from another material, so that scattering due to interfaces of different materials are reduced to a minimum.

Thus, an attenuated phase shifting mask with buried absorbers is described.

METHODS OF FABRICATION

A variety of prior art processes can be adapted to fabricate the buried absorber mask of the present invention. However, novel and preferred methods for manufacturing such masks are described below.

A method for fabricating a mask 30a of the present invention is shown in FIGS. 6–11. Actually there are two methods illustrated in FIGS. 6–11, but the front end of the process as shown in FIGS. 6–10 are similar for both methods. FIG. 11A shows one method of completing the mask from the step described in reference to FIG. 10, while FIG. 11B shows another method of completing the mask from FIG. 10.

Figure 6:
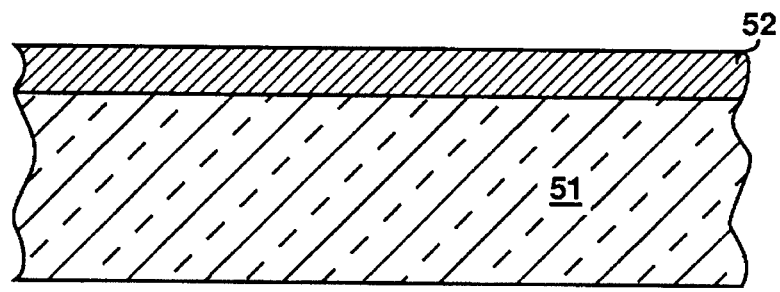
FIG. 6 is a cross-sectional diagram showing a formation of a photoresistive layer on a mask substrate for fabricating an attenuated phase shifting mask of the present invention.
Figure 7:
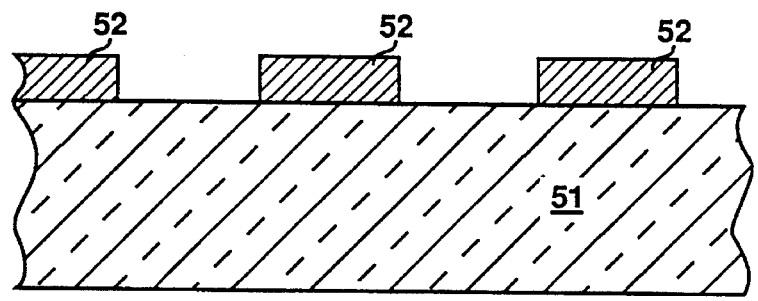
FIG. 7 is a cross-sectional diagram showing a patterning of the photoresistive layer of FIG. 6 to expose portions of the underlying substrate.
Figure 8:
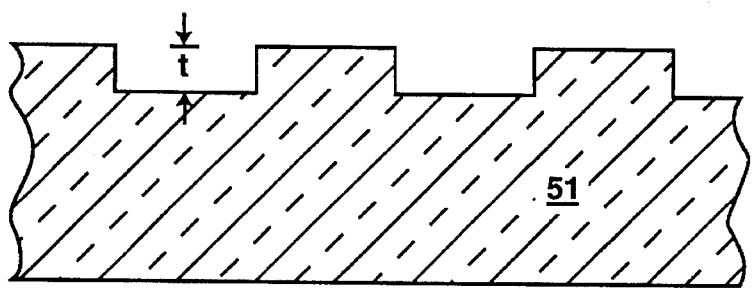
FIG. 8 is a cross-sectional diagram showing the etching of the exposed substrate of FIG. 7 to form trench openings in the substrate.

Referring to FIG. 6, a quartz substrate 51 or mask "blank" is shown having a photoresistive layer 52 formed thereon. The quartz substrate 51 typically has a thickness in the approximate range of 90–250 mils. Quartz substrates currently used as mask blanks for fabricating photomasks can be readily used as substrate 51. It is important to note that the quartz blank should not contain any chromium or other absorber coating. The photoresistive layer 52 is formed on the substrate 51 by using any number of prior art techniques. The photoresistive layer 52 is then patterned using a conventional optical or electron beam (e-beam) lithography that exposes portions of the photoresistive layer 52. It should be noted that if e-beam lithography is utilized, an anti-static layer may be necessary to prevent charging. The anti-static layer (if used) is placed on the surface of the quartz 51 below the photoresistive layer 52. The result of performing lithographic exposure and development to pattern the photoresistive layer 52 is shown in FIG. 7, in which patterned openings expose portions of quartz 51.

The exposed areas of quartz 51 are then etched to form trenches using a dry etch process, such as a plasma etch process using a fluorine based or other chemistry, used in standard practice to a depth t which corresponds to the earlier described thickness for the buried absorber. The etch depth will depend on the absorber material that will be used and the attenuation factor of the PSM. The etch rate of the quartz is well characterized and, therefore, t can be obtained having a uniformity of 5% or better. Following the quartz etch, the photoresistive layer 52 is removed, leaving the patterned quartz shown in FIG. 8.

Figure 9:
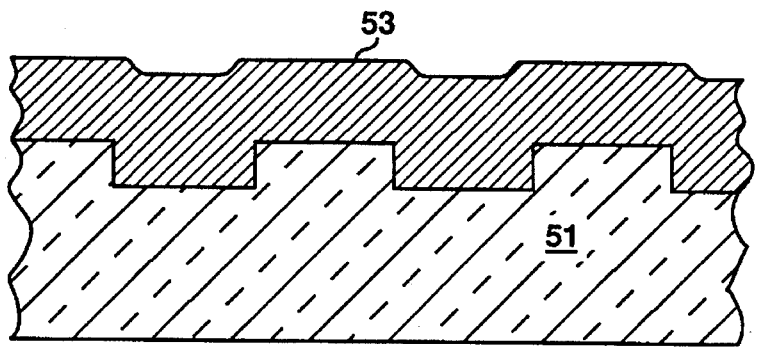
FIG. 9 is a cross-sectional diagram showing a coating of the substrate of FIG. 8 to fill the open trenches of the substrate with a light absorbing material.

Referring to FIG. 9, the patterned quartz substrate is then blanket coated with a selected absorber material 53 using techniques such as sputtering, evaporation or chemical vapor deposition (CVD). A variety of prior art materials that are known as light absorbers can be utilized for absorber layer 53. More specifically, a number of absorber films are used in the prior art for mask fabrication and these materials can be readily used for layer 53. Although not limited to these, examples of absorber films are chromium, molybdenum, tantalum and silicon. As noted earlier, materials having higher absorbtivity than Cr are preferred in order to reduce the thickness of the absorber layer. A metallic film of higher absorbtivity is preferred for the absorber material of the present invention, although silicon can be used if desired.

Figure 10:
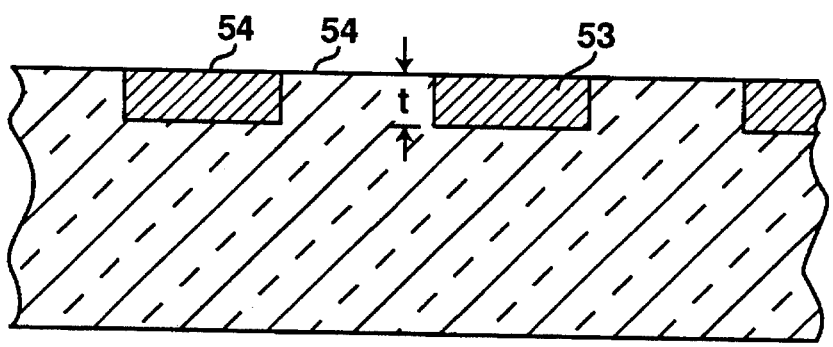
FIG. 10 is a cross-sectional diagram showing the results of etching the surface of the mask of FIG. 9 to have light absorbing material removed from the surface of the substrate, but retaining the absorber material in the trenches.

Subsequently, as shown in FIG. 10, the absorber layer 53 is etched back using a global etch process that has high selectivity between the quartz and the absorber. Chemical-mechanical polishing (CMP) is a preferred technique since excellent polish selectivity can be achieved. Since the absorber layer 53 is generally metallic in most instances, high selectivity can be obtained between the metal film 53 and quartz 51. The CMP process can be used to stop on the quartz with good precision. Furthermore, the CMP is also effective in removing particles and other defects, thereby producing a flat defect-free surface 54. As shown in FIG. 10, the quartz openings are filled with the absorber material. Next, the quartz substrate is cleaned and processed by one of the following two alternative steps.

Referring to FIG. 11 A, a dielectric layer 55, such as a silicon oxide $SiO_2$ layer, is deposited over the quartz substrate of FIG. 10. Since it is deposited on a planar surface, the topography of this layer 55 has substantial thickness uniformity. Layer 55 is deposited to a depth d, which corresponds with the offset distance d of the absorber from the surface of the substrate 51. Any of a wellknown prior art techniques, such as chemical vapor deposition (CVD) process, can be used to deposit layer 55. The absorber material 53 is fully encapsulated and has the offset distance d determined by the thickness of the dielectric layer 55.

However, since a CVD deposited dielectric material, even $SiO_2$, will have an index of refraction different than that of quartz, precise matching of layer 55 to quartz will likely result in phase shifting problems. This is particularly true at 193 nm where $SiO_2$ absorbtivity is high. Thus, an alternative (and slightly more complicated) process is described in reference to FIG. 11B. In this approach, a quartz plate 58 is bonded on to the quartz substrate 51 of FIG. 10. This second quartz layer 58 should be of sufficient thickness for etchback. A thickness of approximately 20 mils is sufficient, although the actual thickness is a design choice. Although a variety of techniques could be used to bond quartz layer 58 onto the quartz substrate 51, the preferred step is performed in a rapid thermal processor (RTP) at a temperature of approximately 800 degrees centigrade in a nitrogen ambient. The higher temperature ensures an extremely strong quartz-to-quartz bond and the nitrogen ambient strengthens the bond so that subsequent delamination does not occur.

Figure 11A:
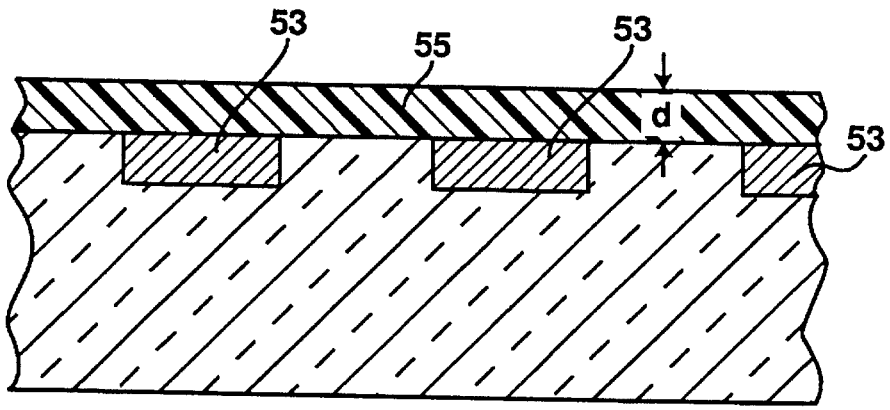
FIG. 11A is a cross-sectional diagram showing a formation of an oxide layer on the surface of the substrate of FIG. 10 to bury the absorber layer.
Figure 11B:
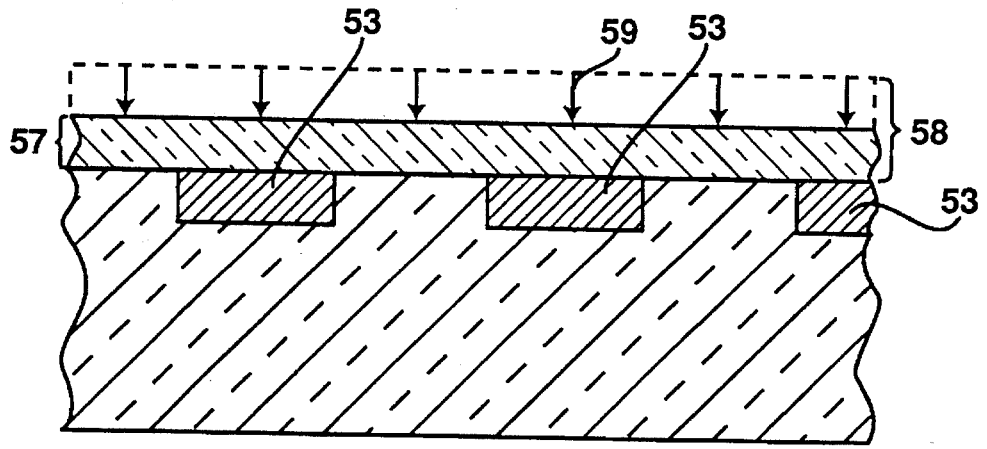
FIG. 11B is a cross-sectional diagram showing a bonding of another layer having the same composition as the substrate on to the surface of the substrate of FIG. 10 to bury the absorber layer and etching back this layer to a specified offset depth.
Figure 12:
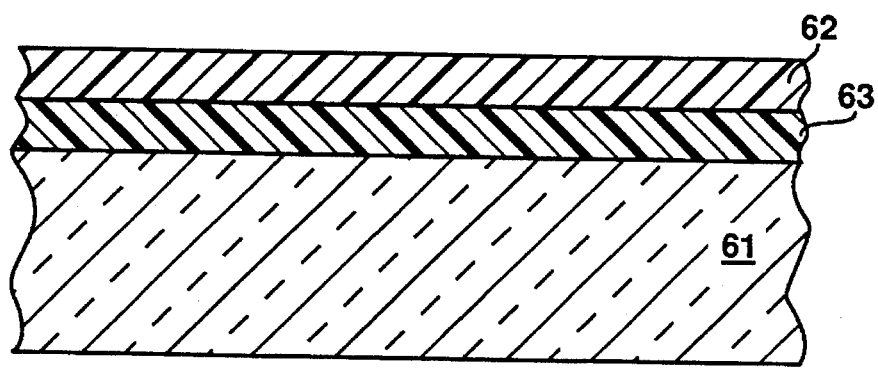
FIG. 12 is a cross-sectional diagram showing a formation of a photoresistive layer above an oxide layer, which is atop a mask substrate, for an alternative method of fabricating an attenuated phase shifting mask of the present invention.

Next the bonded layer 58 is etched back as shown by arrows 59 in FIG. 11B to a thickness 57 of approximately 5000 Å–5 μm. A combination of CMP and chemical etch techniques are used. Initially, bulk of the layer 58 is removed using CMP. Then, a chemical etch (either wet or dry), well-known in the prior art, is used to carefully etch back the remaining quartz until thickness 57 is reached. The chemical etch process will allow for precise control of the etch-back to a final thickness within a tolerance of 5% or less. Thickness 57 is the offset distance d for the absorber 53, which distance determines the amount of phase shift provided in the mask. The quartz-to-quartz bond results essentially in a single quartz substrate so that this interface does not present a change of the refraction index for the light rays traversing through the quartz.

A completely different and alternative method for fabricating an attenuated, buried absorber PSM 30a of the present invention is described in reference to FIGS. 12–15. Instead of forming absorber regions and encapsulating them, this alternative approach utilizes an ion implantation technique to implant metal ions below the surface of the substrate.

Figure 13:
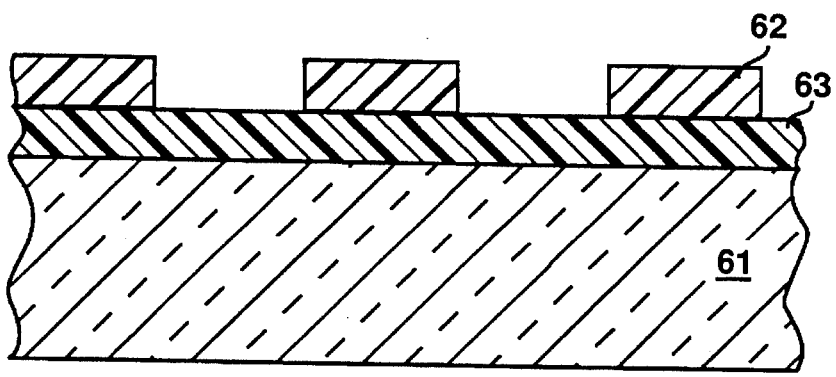
FIG. 13 is a cross-sectional diagram showing a patterning of the photoresistive layer of FIG. 12 to expose portions of the underlying oxide layer.

Referring to FIGS. 12–15, a quartz substrate 61 or mask "blank", equivalent to that of quartz substrate 51, is coated with an oxide layer 63, such as a $SiO_2$ film layer, to a thickness of approximately 1 μm using a prior art technique, such as deposition by a CVD process. Next, the $SiO_2$ layer 63 is coated with a photoresistive layer 62 using known techniques for depositing photoresists. The photoresistive layer 62 is then patterned using a known lithographic technique, such as the afore-mentioned e-beam or optical exposure process. After forming the pattern on layer 62, which is shown in FIG. 13, the underlying SiO$_2$ layer 63 is patterned using an etch process, preferably a dry etch process using fluorine based chemistry, to expose portions of quartz substrate 61.

Figure 14:
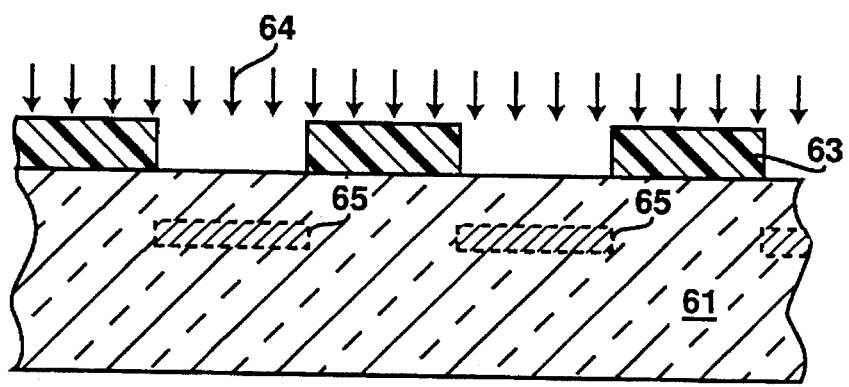
FIG. 14 is a cross-sectional diagram showing results of etching exposed portions of the oxide layer of FIG. 13 to expose portions of the underlying substrate and formation of buried absorber regions by implanting ions into the exposed portions of the substrate.

After patterning the SiO$_2$ layer 63, the photoresistive layer 62 is stripped. Next, the substrate 61 is subjected to an implantation step in which metal ions are implanted into the exposed portions of the quartz 61 by high energy implantation as shown in FIG. 14. The SiO$_2$ functions as a shielding layer so that the implantation occurs only into the exposed quartz. Implantation dosage in the range of $3 \times 10^{17}/cm^2$–$2 \times 10^{18}/cm^2$ at energy levels in the range of 1–5 MeV will implant metal ions to a depth ranging from 5000 Å to 2 µm. At these dose and energy levels, the metal ions will form a continuous metallic layer 65 in the quartz 61 matrix, wherein layer 65 will have a thickness in the range of 500 Å–800 Å. The actual depth of implantation, as well as the thickness of the implanted layer 65 is a design choice and will be determined by the application of the mask for which it is being fabricated. Furthermore, a variety of metal ions can be used for implantation. Although not limited to these ions, examples of metal ions are chromium ($Cr^+$), gold ($Au^+$), titanium ($Ti^+$) and tantalum ($Ta^+$).

Figure 15:
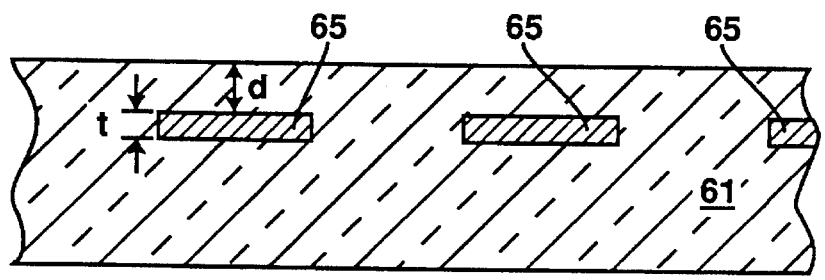
FIG. 15 is a cross-sectional diagram showing the mask with buried absorber regions after the implantation of FIG. 14 and the removal of the oxide layer.

Finally, as is shown in FIG. 15, the remaining SiO$_2$ 63 is stripped and the quartz substrate 61 is annealed at approximately 1000 degrees centigrade to remove any residual implant damage in the quartz 61. The substrate 61 is then cleaned and inspected. The implanted layer 65 is the buried absorber layer of the PSM 30a. Thus, the thickness of this layer 65 corresponds to thickness t of the buried absorber and the implant depth corresponds to the offset distance d of the mask. By utilizing this method, absorber thickness t and offset distance d can be tightly controlled.

Figure 16:
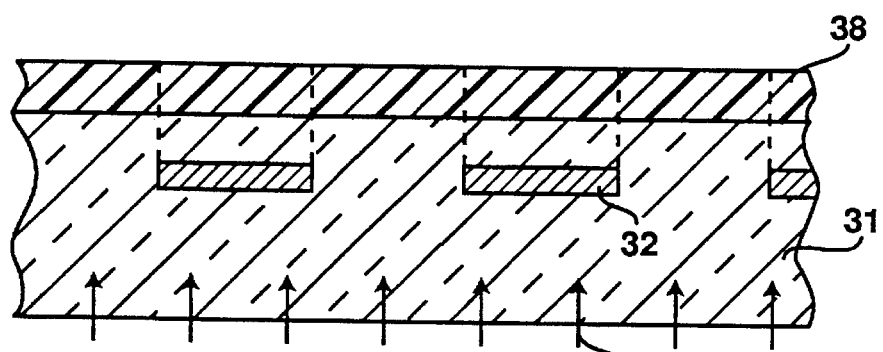
FIG. 16 is a cross-sectional diagram showing a formation of a photoresistive layer over a planarized surface of a mask referenced in FIGS. 11A, 11B or 15 in order to fabricate the alternative mask of the present invention shown in FIG. 5A.
Figure 17:
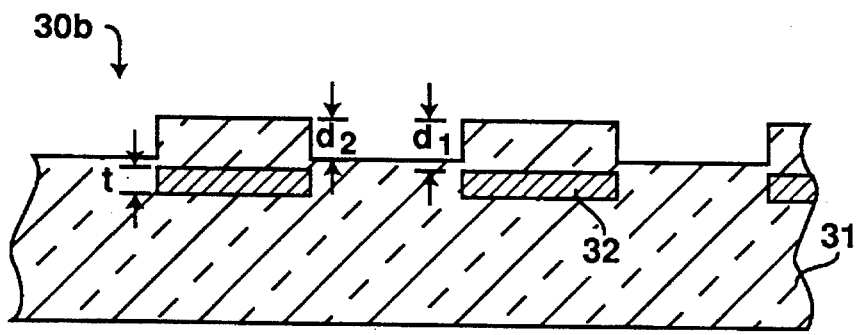
FIG. 17 is a cross-sectional diagram showing an etching of a region of the mask substrate residing in a non-shifted region in order to fabricate the alternative mask of the present invention shown in FIG. 5A.

Referring to FIGS. 16 and 17, a method for fabricating the alternative embodiment of the present invention as shown in FIG. 5A is illustrated. It is to be noted that mask 30b is fabricated as an extension of the fabrication process for mask 30a. That is, the completed masks shown in FIGS. 11A, 11B and 15 are further processed to fabricate mask 30b. It should be emphasized that it is preferred to use only the masks from FIGS. 11B and 15, since these masks utilize the same material as the substrate, namely quartz, for the region above the absorbers.

In FIG. 16, a photoresistive layer 38 is formed over the planar surface of substrate 31. Then, the photoresist layer 38 is subjected to a backside flood exposure of ultra-violet light 39. The absorbers 32 operate as a self-aligned mask in order to selectively expose only portions of the photoresistive layer 38. Thus, only the photoresist overlying non-shifting regions are exposed. Next, with the photoresistive layer 38 patterned, the quartz in the non-shifting regions is etched using the afore-mentioned quartz etch technique, which is well characterized. The quartz is etched to the required offset distance d to form trenches 35b in the non-shifted regions. The remaining photoresistive layer 38 is stripped and the mask cleaned to obtain the mask 30b, which is shown in FIG. 17. The purpose of the overlying quartz region is to provide the additional phase shift necessary to obtain the required total phase shift (usually 180°).

Thus, several techniques for fabricating the two buried absorber, attenuated PSMs of the present invention are described.

I claim:

1. An attenuated phase shifting photolithography mask for use in projecting an image pattern onto a target comprising:

a mask substrate formed from a substantially transparent material for permitting light transmission therethrough;

an absorber pattern, formed from a light absorbing material and buried a set distance below a surface of said substrate and not adjacent to said surface, for absorbing a significant portion of light transmission therethrough to form a phase shifting attenuator pattern in said substrate, such that light attenuation and phase shifting achieved in phase shifting regions of said mask are both obtained from said light absorbing material at a set wavelength of transmitted light;

wherein having said attenuator pattern buried below said surface of said substrate but not adjacent to said surface, allows for light scattered from surface areas of said attenuator pattern to be reflected back into said substrate at a surface interface of said substrate, in order to improve image feature definition at said target; and wherein having said attenuator pattern buried below said surface at said set distance is of sufficient depth in order to provide for a maximum depth of focus of an exposure system being utilized to reside within said substrate, such that surface defects and contaminants at said surface interface are not imaged on to said target.

2. The mask of claim 1 wherein said surface of said substrate has a substantially planar surface.

3. The mask of claim 2 wherein said light absorbing material is comprised of a metallic film.

4. The mask of claim 3 wherein said attenuator pattern has a thickness to attenuate approximately 85–95% of light transmitting therethrough.

5. The mask of claim 4 wherein said attenuator pattern provides for a 180° phase shift of said light transmitting therethrough.

6. The mask of claim 5 wherein said mask substrate is made from quartz.

7. An attenuated phase shifting photolithography mask for use in projecting an image pattern onto a target comprising:

a mask substrate formed from a substantially transparent material for permitting light transmission therethrough, said substrate having trenches on its surface corresponding to non-phase shifting regions and wherein said trenches have a depth corresponding to a set distance $d_2$;

an absorber pattern formed from a light absorbing material and buried at a distance $d_1$ from said substrate surface, in which said distance $d_1$ is greater than said set distance $d_2$, and disposed below said surface of said substrate at phase shifting regions and not adjacent to said surface;

said absorber pattern for absorbing a significant portion of light transmission therethrough to form an attenuator pattern in said substrate, such that light attenuation is obtained from said light absorbing material and phase shifting is determined by a combination of said light absorbing material and trench depth $d_2$;

wherein having said attenuator pattern buried below said surface of said substrate but not adjacent to said surface, allows for light scattering at said attenuator pattern to be reflected back into said substrate at a surface interface of said substrate, in order to improve image feature definition; and wherein having said attenuator pattern buried below said surface at said distance $d_1$ is of sufficient depth in order to provide for a maximum depth of focus of an exposure system being utilized to reside within said substrate, such that surface defects and contaminants at said surface interface are not imaged on to said target.

8. The mask of claim 7 wherein said light absorbing material is comprised of a metallic film.

9. The mask of claim 8 wherein said attenuator pattern has a thickness to attenuate approximately 85–95% of light transmitting therethrough.

10. The mask of claim 9 wherein said offset distance for said attenuator pattern is set for a 180° phase shift.

11. The mask of claim 10 wherein said mask substrate is made from quartz.

12. A method of fabricating an attenuated phase shifting photolithography mask for use in projecting an image onto a target, comprising the steps of:

forming a photoresistive layer over a mask substrate;

patterning said photoresistive layer to expose portions of said substrate underlying said photoresistive layer;

etching said exposed portions of said substrate to a predefined depth to form trenches in said substrate;

removing remaining portions of said photoresistive layer;

depositing a layer of light absorbing material over said substrate and filling said trenches;

selectively etching back said layer of light absorbing material until only said trenches are filled with said light absorbing material;

forming a dielectric layer of a predefined thickness over said substrate and said trenches to form an upper boundary region of said mask in order to bury said light absorbing material below a surface of said mask now formed by exposed surface of said dielectric layer;

wherein said absorbing material forms an attenuator pattern below said surface of said mask and not adjacent to said surface, such that light attenuation is obtained from said light absorbing material and an amount of phase shifting is obtained from said light absorbing material at a set wavelength of transmitted light;

wherein having said attenuator pattern buried below said surface of said mask allows for light scattered from surface areas of said attenuator pattern to be reflected back into said mask at a surface interface of said substrate, in order to improve image feature definition at said target; and wherein having said attenuator pattern buried below said surface is at a distance of sufficient depth in order to provide for a maximum depth of focus of an exposure system being utilized to reside within said substrate, such that surface defects and contaminants at said surface interface are not imaged on to said target.

13. The method of claim 12 wherein said absorbing material has a thickness t to provide both required attenuation and required phase shifting for said mask.

14. The method of claim 13 wherein said mask substrate is made from quartz and said step of forming said dielectric layer is comprised of depositing an oxide layer of said thickness t.

15. The method of claim 13 wherein said mask substrate is made from quartz and said step of forming said dielectric layer is comprised of bonding a quartz layer, having a thickness greater than said predefined thickness, onto said quartz substrate and etching back said quartz layer to said predefined thickness.

16. The method of claim 14 wherein said absorbing material provides said required attenuation, but only provides a fraction of said required phase shifting, wherein trenches are formed in non-phase shifting areas not overlying said attenuator pattern, so that total phase shifting is determined by a combination of said absorbing material and a difference in thickness of dielectric layer overlying said absorbing material and substrate material absent in said trenches, such difference being depth d of said trenches.

17. The method of claim 15 wherein said absorbing material provides said required attenuation, but only provides a fraction of said required phase shifting, wherein trenches are formed in non-phase shifting areas not overlying said attenuator pattern, so that total phase shifting is determined by a combination of said absorbing material and a difference in thickness of dielectric layer overlying said absorbing material and substrate material absent in said trenches, such difference being depth d of said trenches.

18. A method of fabricating an attenuated phase shifting photolithography mask for use in projecting an image onto a target, comprising the steps of:

forming an oxide layer over a mask substrate;

forming a photoresistive layer over said oxide layer;

patterning said photoresistive layer to expose portions of said oxide layer underlying said photoresistive layer;

etching said exposed portions of said oxide layer to expose portions of said underlying substrate;

removing remaining portions of said photoresistive layer, but leaving patterned portions of said oxide layer;

implanting doped ions into exposed portions of said substrate to a set depth below exposed surface of said substrate to form patterned light absorbing regions in said substrate and not adjacent to said surface;

removing remaining portion of said oxide layer such that said substrate has a substantially planar surface with buried light absorbing regions forming an attenuator pattern;

wherein said absorbing material forms an attenuator pattern below said surface of said mask, such that light attenuation is obtained from said light absorbing material and an amount of phase shifting is obtained from said light absorbing material at a set wavelength of transmitted light;

wherein having said attenuator pattern buried below said surface of said mask allows for light scattered from surface areas of said attenuator pattern to be reflected back into said mask at said surface, in order to improve image feature definition at said target; and wherein having said attenuator pattern buried below said surface is at a distance of sufficient depth in order to provide for a maximum depth of focus of an exposure system being utilized to reside within said substrate, such that surface defects and contaminants at said surface interface are not imaged on to said target.

19. The method of claim 18 wherein thickness of said attenuator pattern in said step of implanting doped ions is determined by dosage of said doped ions implanted into said substrate.

20. The method of claim 19 wherein said set depth of implanting doped ions is determined by an amount of implanting energy imparted on said ions during said step of implanting them.

21. The method of claim 20 wherein said dosage for implantation is in an approximate range of $3 \times 10^{17}/cm^2 - 2 \times 10^{18}/cm^2$.

22. The method of claim 21 wherein said implanting energy is in an approximate range of 1–5 million electron volts.

23. The method of claim 20 wherein said absorbing material has a thickness t to provide both required attenuation and required phase shifting for said mask.

24. The method of claim 23 wherein said mask substrate is made from quartz.

25. The method of claim 20 wherein said absorbing material provides said required attenuation, but only provides a fraction of said required phase shifting, wherein trenches are formed in non-phase shifting areas not overlying said attenuator pattern, so that total phase shifting is determined by a combination of said absorbing material and a difference in thickness of substrate material overlying said absorbing material and substrate material absent in said trenches, such difference being depth d of said trenches.

26. The method of claim 25 wherein said mask substrate is made from quartz.

* * * * *

UNITED STATES PATENT AND TRADEMARK OFFICE
CERTIFICATE OF CORRECTION

PATENT NO : 5,480,747
DATED : January 2, 1996
INVENTOR(S): Prahalad K. Vasudev

It is certified that error appears in the above-identified patent and that said Letters Patent is hereby corrected as shown below:

Column 6, line 9, "an" should be --a--.

Column 6, line 10, remove "burried".

Column 6, line 16, ""imbedded"" should be --embedded (buried)--.

Column 6, line 55, "k~0" should be --k≈0--.

Column 8, line 59, insert --materials-- after "semiconductor".

Column 8, line 64, remove "where".

Signed and Sealed this

Fifth Day of August, 1997

Attest:

Attesting Officer

BRUCE LEHMAN
Commissioner of Patents and Trademarks